United States Patent
Chen et al.

(10) Patent No.: US 8,593,878 B2
(45) Date of Patent: Nov. 26, 2013

(54) PROGRAM METHOD AND FLASH MEMORY USING THE SAME

(75) Inventors: Han-Sung Chen, Hsinchu (TW); Ming-Chao Lin, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 158 days.

(21) Appl. No.: 13/298,460

(22) Filed: Nov. 17, 2011

(65) Prior Publication Data

US 2013/0128672 A1    May 23, 2013

(51) Int. Cl.
 *G11C 16/06*    (2006.01)
(52) U.S. Cl.
 USPC ............ 365/185.22; 365/185.18; 365/185.23; 365/185.28; 365/185.33
(58) Field of Classification Search
 None
 See application file for complete search history.

(56) References Cited

U.S. PATENT DOCUMENTS

| | | | |
|---|---|---|---|
| 7,848,177 B2 | 12/2010 | Kajiyama et al. | |
| 2008/0037326 A1* | 2/2008 | Kim et al. | 365/185.18 |
| 2010/0103745 A1 | 4/2010 | Cernea | |
| 2013/0100735 A1* | 4/2013 | Lee et al. | 365/185.2 |

* cited by examiner

*Primary Examiner* — Tan T. Nguyen
(74) *Attorney, Agent, or Firm* — McClure, Qualey & Rodack, LLP

(57) ABSTRACT

A program method, applied in a flash memory, includes the following steps. Firstly, a first memory sector and a second memory sector are selected, wherein the first and the second memory sectors respectively correspond to a first word line and a second word line. Next, a first operation phase and a second operation phase are determined. Then, the first word line is biased with a first setup voltage, and the second word line is driven in one of a program operation and a program-verification operation, in the first operation phase. After that, the second word line is biased with a second setup voltage, and the first word line is driven in the other one of the program operation and the program-verification operation in the second operation phase.

20 Claims, 3 Drawing Sheets

PROGRAM METHOD AND FLASH MEMORY USING THE SAME

BACKGROUND OF THE INVENTION

1. Field of the Invention

The invention relates in general to a program method and a flash memory using the same, and more particularly to a program method and a flash memory with improved access performance.

2. Description of the Related Art

In the present age, non-volatile memory devices have become more popular for use in various electronic devices. For example, flash memory is one of the most popular non-volatile semiconductor memories applied in the present age. In detail, flash memory includes flash memory cells with programmable threshold voltages, so that each of the flash memory cells can be programmed to indicate at least one bit of data.

Since there are always demands for flash memories with higher operation speed, how to provide a program method capable of achieving higher operation speeds is still a prominent object for the industries.

SUMMARY OF THE INVENTION

The invention is directed to a program method and a flash memory using the same. The program method directed to by the invention selects a first and a second memory sectors respectively corresponding to a first and a second word lines and determines a first and a second operation phases. The program method directed to by the invention further has the first word line biased with a first setup voltage and the second word line driven in one of a program operation and a program-verification operation in the first operation phase, and has the second word line biased with a second setup voltage and the first word line driven in the other one of the program and the program-verification operations in the second operation phase. Thus, in comparison to the convention flash memory, the program method and the flash memory using the same are advantageously capable of saving the voltage setup phases needed for the program and the program-verification operations of each of the first and the second memory sectors, and thus achieving higher operation speed.

According to a first aspect of the present invention, a program method, applied in a flash memory, is provided. The program method includes the following steps. Firstly, a first memory sector and a second memory sector are selected, wherein the first and the second memory sectors respectively correspond to a first word line and a second word line. Next, a first operation phase and a second operation phase are determined. Then, the first word line is biased with a first setup voltage, and the second word line is driven in one of a program operation and a program-verification operation, in the first operation phase. After that, the second word line is biased with a second setup voltage, and the first word line is driven in the other one of the program operation and the program-verification operation in the second operation phase.

According to a second aspect of the invention, a flash memory is provided. The flash memory includes a memory array, a memory accessing circuit, and a control circuit. The control circuit is connected to the memory array and the memory accessing circuit for selecting a first memory sector and a second memory sector, which are respectively correspond to a first word line and a second word line, in the memory array. The control circuit further determines a first and a second operation phases. The control circuit has the first word line biased with a first setup voltage and has the second word line driven in one of a program operation and a program-verification operation, via the memory accessing circuit in the first operation phase. The control circuit further has the second word line biased with a second setup voltage and has the first word line driven in the other one of the program operation and the program-verification operation, via the memory accessing circuit in the second operation phase.

The invention will become apparent from the following detailed description of the preferred but non-limiting embodiments. The following description is made with reference to the accompanying drawings.

DETAILED DESCRIPTION OF THE INVENTION

Figure 1:
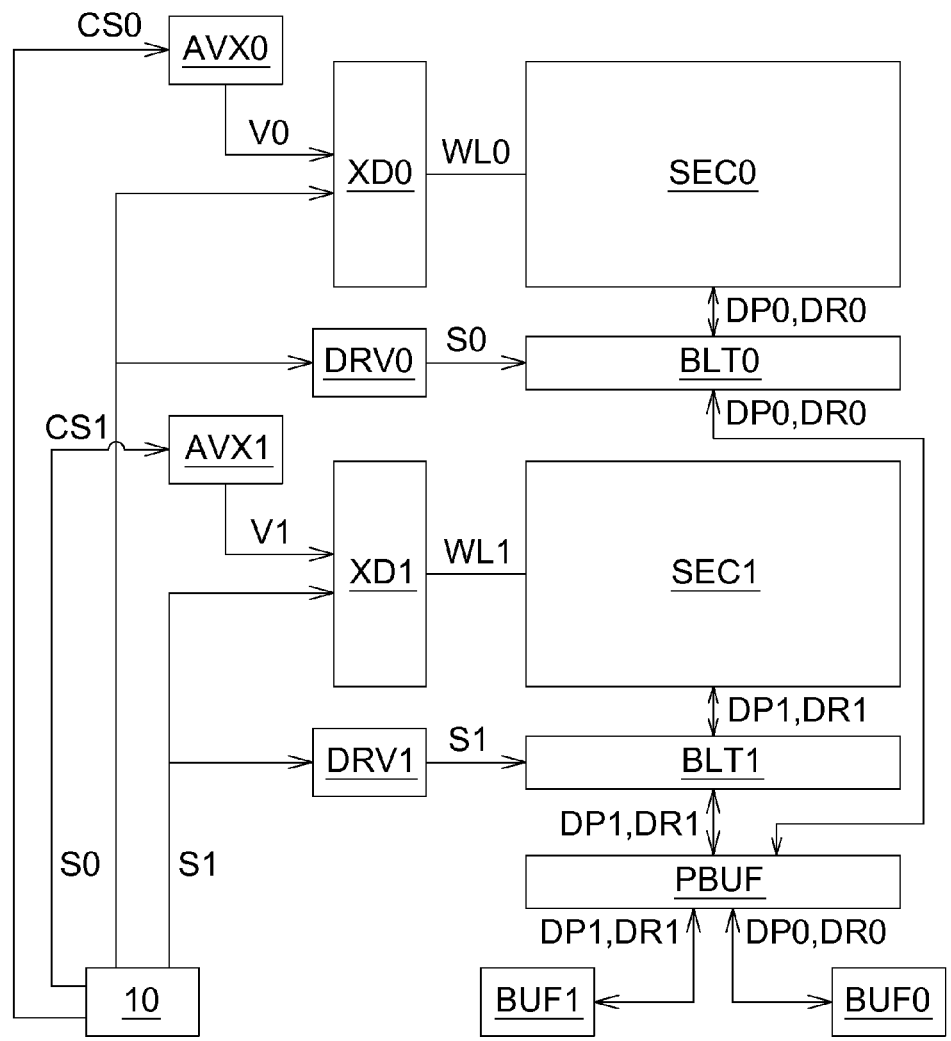
FIG. 1 is a block diagram of a flash memory according to an embodiment of the invention.

Referring to FIG. 1, a block diagram of a flash memory according to an embodiment of the invention is shown. The flash memory 1 includes a memory array, a memory accessing circuit, and a control circuit 10. The memory array includes a number of memory sectors. In the present embodiment, only two of the memory sectors SEC0 and SEC1 are shown in FIG. 1, wherein the memory sectors SEC0 and SEC1 respectively correspond to word lines WL0 and WL1. In an example, the memory sectors SEC0 and SEC1 correspond to adjacent physical addresses. In other words, one of the memory sectors SEC0 and SEC1 corresponds to odd-numbered physical address, and the other one of the memory sectors SEC0 and SEC1 corresponds to even-numbered physical address.

In still another example, one of the memory sectors SEC0 and SEC1 correspond to a physical address located in a first half of the memory array, while the other one of the memory sectors SEC0 and SEC1 correspond to bottom half of the memory array.

The accessing circuit, for example, includes a x decoders XD0 and XD1, bias circuits AVX0 and AVX1, bit line selectors BLT0 and BLT1, bit line drivers DRV0 and DRV1, page buffer PBUF, and data buffers BUF0 and BUF1. The bias circuit AVX0 is driven by a control signal CS0 to provide a setup voltage V0 to the word lines WL0 through the x decoder XD0. The bias circuit AVX1 is driven by a control signal CS1 to provide a setup voltage V1 to the word lines WL1 through the x decoder XD1.

In program operation, the data buffers BUF0 and BUF1 respectively store program data DP0 corresponding to the memory sector SEC0 and program data DP1 corresponding to the memory sector SEC1. Besides, one piece of the program data DP0 and DP1 are selectively loaded into the page buffer PBUF. In program verification operation, the page buffer PBUF receives read data DR0 and DR1 read from one of the memory sectors SEC0 and SEC1, and compares the read data with the corresponding data buffers BUF0 and BUF1.

The bit line driver DRV0 is driven by a select signal S0 to control the bit line selectors BLT0, so that the program data DP0 loaded in the page buffer PBUF can be provided to the memory sector SEC0. Similarly, the bit line driver DRV1 is driven by a select signal S1 to control the bit line selectors BLT1, so that the program data DP1 loaded in the page buffer PBUF can be provided to the memory sector SEC1.

Figure 2:
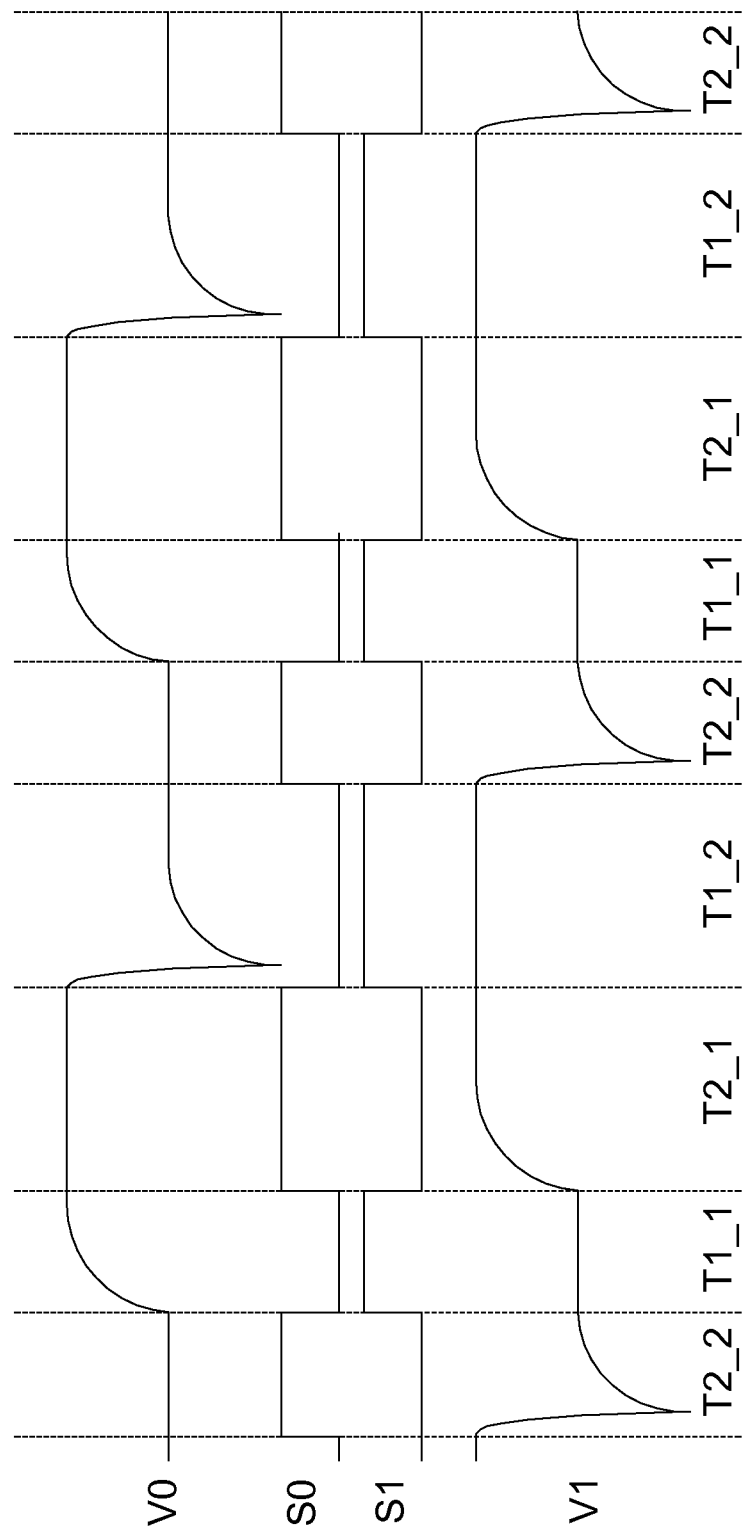
FIG. 2 is a timing diagram for related signals of the flash control circuit 10.

Referring to FIG. 2, a timing diagram for related signals of the flash control circuit 10 is shown. The control circuit 10 provides the control signals S0, S1, and the select signals S0, S1, so as to coordinate the operations of each subunits of the memory accessing circuit. In an example, the control circuit 10 determines operation phases T1_1, T2_1, T1_2, and T2_2. In the following paragraphs, examples are cited for illustrating the operation of the control circuit 10 in each of the operation phases T1_1, T2_1, T1_2, and T2_2.

Operation Phase T1_1

In the operation phase T1_1, the control circuit 10 provides the control signal CS0 to the bias circuit AVX0 for having the word line WL0 biased with the setup voltage V0, and further provides the select signal S0 for disabling the bit line selector BLT0 and accordingly preventing the program data DP0 from entering the memory sector SEC0 or preventing the read data DR0 from outputting to the page buffer PBUF. In other words, the control circuit 10 achieves word line setup operation for the memory sector SEC0, to accordingly having the word line WL0 biased to the setup voltage V0 in the operation phase T1_1. For example, the setup voltage V0 corresponds to a voltage level for program operation in the operation phase T1_1.

In the operation phase T1_1, the word line WL1 is set at the setup voltage V1, which, for example, corresponds to a voltage level for program-verification operation in a previous operation phase T2_2. Besides, the control circuit 10 further provides the select signal S1 to the bit line driver DRV1 for enabling the bit line selector BLT1, so that the read data DR1 stored in the memory sector SEC1 are read to page buffer PBUF and compare with the data in buffer BUF1 to verify program pass or fail. In other words, the control circuit 10 achieves the program-verification operation for the memory sector SEC1, to accordingly read the read data DR1 from the memory sector SEC1 and achieve program-verification operation.

That is to say, the word line setup operation, for program operation of the memory sector SEC0, and the program-verification operation, for the memory sector SEC1, are substantially simultaneously achieved in the operation phase T1_1.

For example, the operation phase T1_1 is set to be long enough for achieving the operation of having the word line WL0 setup for program operation and the program-verification operation of the memory sector SEC1. In an embodiment, the time T(1), needed for setting the word line WL0 for program operation, is shorter than the time T(2), needed for program-verification operation of the memory sector SEC1. Thus, the operation phase T1_1 is accordingly set as the time T(2), with the time T(1) fully overlapped with the time T(2). In other words, the time needed for setting the word line WL0 for program operation is fully saved.

In another embodiment, the time T(1), needed for setting the word line WL0 for program operation, is longer than the time T(2), needed for program-verification operation of the memory sector SEC1. Thus, the operation phase T1_1 is accordingly set as the time T(1). In other words, the time needed for setting the word line WL0 for program operation is partially saved.

Operation Phase T2_1

In the operation phase T2_1, the word line WL0 is previously set at the setup voltage V0, which corresponds to a voltage level for program operation in the operation phase T1_1. Besides, the control circuit 10 further provides the select signal S0 to the bit line driver DRV0 for enabling the bit line selector BLT0, so that the program data DP0, stored in the data buffer BUF0, are provided to page buffer PBUF and accordingly programmed into the memory sector SEC0. In other words, the control circuit 10 achieves the program operation for the memory sector SEC0 in the operation phase T2_1.

In the operation phase T2_1, the control circuit 10 further provides the control signal CS1 to the bias circuit AVX1 for having the word line WL1 biased with the setup voltage V1, and further provides the select signal S1 for disabling the bit line selector BLT1 and accordingly preventing the program data DP1 from entering the memory sector SEC1 or preventing the read data DR1 from outputting to the page buffer PBUF. In other words, the control circuit 10 achieves word line setup operation for the memory sector SEC1, to accordingly having the word line WL1 biased to the setup voltage V1 in the operation phase T2_1. For example, the setup voltage V1 corresponds to a voltage level for program operation in the operation phase T2_1.

That is to say, the word line setup operation, for program operation of the memory sector SEC1, and the program operation, for the memory sector SEC0, are substantially simultaneously achieved in the operation phase T2_1.

For example, the operation phase T2_1 is set to be long enough for achieving the program operation of the memory sector SEC0 and the operation for having word line WL1 setup for program operation. In an embodiment, the time T(3), needed for program operation of the memory sector SEC0, is longer than the time T(4), needed for setting up the word line WL1 for program operation, and the operation phase T1_2 is accordingly set as the time T(3). In other words, the time needed for setting the word line WL1 for program operation is fully saved.

In another embodiment, the time T(3), needed for program operation of the memory sector SEC0, is shorter than the time T(4), needed setting the word line WL1 for program operation, and the operation phase T1_2 is accordingly set as the time T(4). In other words, the time needed for setting the word line WL1 for program operation is partially saved.

Operation Phase T1_2

In the operation phase T1_2, the control circuit 10 provides the control signal CS0 to the bias circuit AVX0 for having the word line WL0 biased with the setup voltage V0, and further provides the select signal S0 for disabling the bit line selector BLT0 and accordingly preventing the program data DP0 from entering the memory sector SEC0 or preventing the read data DR0 from outputting to the page buffer PBUF. In other words, the control circuit 10 achieves word line setup operation for the memory sector SEC0, to accordingly having the word line WL0 biased to the setup voltage V0 in the operation phase T1_2. For example, the setup voltage V0 corresponds to a voltage level for program-verification operation in the operation phase T1_2.

In the operation phase T1_2, the word line WL1 is previously set at the setup voltage V1, which, for example, corresponds to a voltage level for program operation in the operation phase T2_1. Besides, the control circuit 10 further provides the select signal S1 to the bit line driver DRV1 for enabling the bit line selector BLT1, so that the program data DP1, stored in the data buffer BUF1, are provided to page buffer PBUF and accordingly programmed into the memory sector SEC1. In other words, the control circuit 10 achieves the program operation for the memory sector SEC1 in the operation phase T1_2.

That is to say, the word line setup operation, for program-verification operation of the memory sector SEC0, and the program operation, for the memory sector SEC1, are substantially simultaneously achieved in the operation phase T1_2.

For example, the operation phase T1_1 is set to be long enough for achieving the operation of having the word line WL0 setup for program-verification operation and the program operation of the memory sector SEC1. In an embodiment, the time T(5), needed for setting the word line WL0 for program-verification operation, is shorter than the time T(6), needed for program operation of the memory sector SEC1. Thus, the operation phase T1_2 is accordingly set as the time T(6), with the time T(5) fully overlapped with the time T(6). In other words, the time needed for setting the word line WL0 for program-verification operation is fully saved.

In another embodiment, the time T(5), needed for setting the word line WL0 for program-verification operation, is longer than the time T(6), needed for program operation of the memory sector SEC1. Thus, the operation phase T1_2 is accordingly set as the time T(5). In other words, the time needed for setting the word line WL0 for program-verification operation is partially saved.

Operation phase T2_2

In the operation phase T2_2, the word line WL0 is previously set at the setup voltage V0, which corresponds to the voltage level for program-verification operation in the operation phase T1_2. Besides, the control circuit 10 further provides the select signal S0 to the bit line driver DRV0 for enabling the bit line selector BLT0, so that the read data DR0 stored in the memory sector SEC0 are read to page buffer PBUF and compare with the data in buffer BUF0 to verify program pass or fail. In other words, the control circuit 10 achieves the program-verification operation for the memory sector SEC0, to accordingly read the read data DR0 from the memory sector SEC0 and achieve program-verification operation.

In the operation phase T2_2, the control circuit 10 further provides the control signal CS1 to the bias circuit AVX1 for having the word line WL1 biased with the setup voltage V1, and further provides the select signal S1 for disabling the bit line selector BLT1 and accordingly preventing the program data DP1 from entering the memory sector SEC1 or preventing the read data DR1 from outputting to the page buffer PBUF. In other words, the control circuit 10 achieves word line setup operation for the memory sector SEC1, to accordingly having the word line WL1 biased to the setup voltage V1 in the operation phase T2_1. For example, the setup voltage V1 corresponds to a voltage level for program-verification operation in the operation phase T2_2.

That is to say, the word line setup operation, for program operation of the memory sector SEC1, and the program-verification operation, for the memory sector SEC0, are substantially simultaneously achieved in the operation phase T2_2.

For example, the operation phase T2_2 is set to be long enough for achieving the program-verification operation of the memory sector SEC0 and the operation for having word line WL1 setup for program-verification operation. In an embodiment, the time T(7), needed for program-verification operation of the memory sector SEC0, is longer than the time T(8), needed for setting up the word line WL1 for program-verification operation, and the operation phase T2_2 is accordingly set as the time T(7). In other words, the time needed for setting the word line WL1 for program-verification operation is fully saved.

In another embodiment, the time T(7), needed for program-verification operation of the memory sector SEC0, is shorter than the time T(8), needed for setting the word line WL1 for program-verification operation, and the operation phase T2_2 is accordingly set as the time T(8). In other words, the time needed for setting the word line WL1 for program-verification operation is partially saved.

Based on the above mentioned paragraphs, it can be obtained that word line setup operations of the memory sector SEC0, e.g. setup for program operation and program-verification operation, are achieved together with the program and the program-verification operations of the memory sector SEC1. Similarly, it can also be obtained that word line setup operations of the memory sector SEC1, e.g. setup for program operation and program-verification operation, are achieved together with the program and the program-verification operations of the memory sector SEC0. Consequently, the flash memory 1 according to the present embodiment is able to save the operation phases, originally needed for word line setup operations of the memory sectors SEC0 and SEC1, and thus accordingly achieve higher operation speed.

Figure 3:
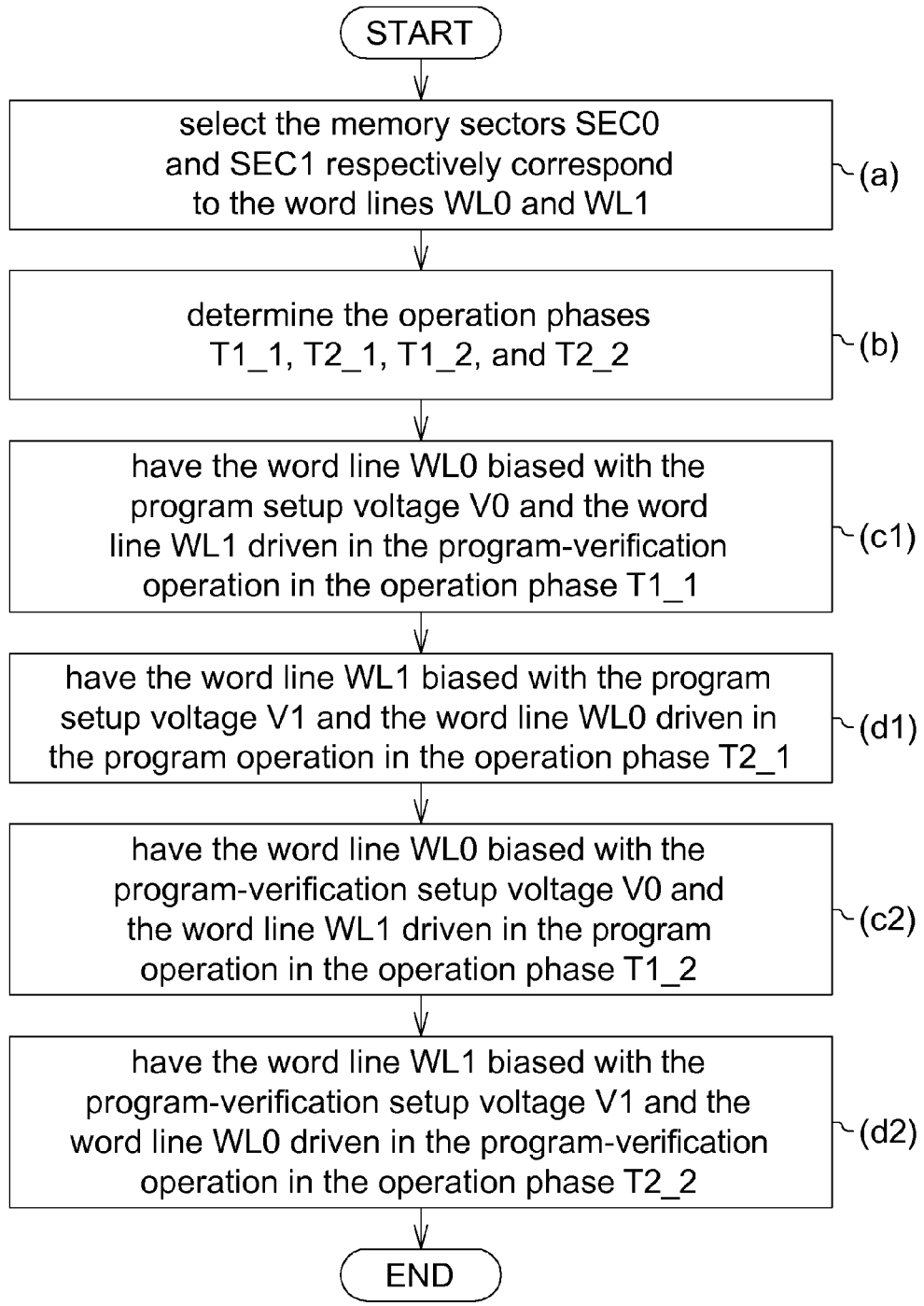
FIG. 3 is a flow chart of a program method according to an embodiment of the invention.

Referring to FIG. 3, a flow chart of a program method according to an embodiment of the invention is shown. The program method according to the present embodiment includes the following steps. Firstly, the program method proceeds to step (a), in which the control circuit 10 selects the memory sectors SEC0 and SEC1 wherein the memory sectors respectively correspond to the word lines WL0 and WL1. Next, the program method proceeds to step (b), in which the control circuit 10 determines the operation phases T1_1, T2_1, T1_2, and T2_2.

Then the program method proceeds to step (c1), in which the control circuit 10 has the word line WL0 biased with the setup voltage V0, corresponding to the voltage level for program operation, and has the word line WL1 driven in the program-verification operation in the operation phase T1_1. Next, the program method proceeds to step (d1), in which the control circuit 10 has the word line WL1 biased with the setup voltage V1, corresponding to the voltage level for program operation, and has the word line WL0 driven in the program operation in the operation phase T2_1.

Then the program method proceeds to step (c2), in which the control circuit 10 further has the word line WL0 biased with the setup voltage V0, corresponding to the voltage level for program-verification operation, and has the word line WL1 driven in the program operation in the operation phase T1_2. After that, the program method proceeds to step (d2), in which the control circuit 10 further has the word line WL1 biased with the setup voltage V1, corresponding to the voltage level for program-verification operation, and has the word line WL0 driven in the program-verification operation in the operation phase T2_2.

The program method according to the present embodiment selects a first and a second memory sectors respectively corresponding to a first and a second word lines, and determines a first and a second operation phases. The program method according to the present embodiment further has the first word line biased with a first setup voltage and the second word line driven in one of a program operation and a program-verification operation in the first operation phase, and has the second word line biased with a second setup voltage and the first word line driven in the other one of the program and the program-verification operations in the second operation phase. Thus, in comparison to the convention flash memory, the program method and the flash memory according to the present embodiment are advantageously capable of saving the voltage setup phases needed for the program and the program-verification operations of each of the first and the second memory sectors, and thus achieving higher operation speed.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A program method, applied in a flash memory, comprising:
   selecting a first memory sector and a second memory sector, wherein the first and the second memory sectors respectively correspond to a first word line and a second word line; and
   having the first word line biased with a first setup voltage, wherein the first setup voltage corresponding to a program setup voltage or a program-verification setup voltage, and having the second word line driven in one of a program operation and a program-verification operation.

2. The program method according to claim 1, when the first setup voltage corresponding to a program setup voltage and the second word line is driven in the program-verification operation.

3. The program method according to claim 1, when the first setup voltage corresponding to a program setup voltage and the second word line is driven in the program operation.

4. The program method according to claim 1, when the first setup voltage corresponding to a program-verification setup voltage and the second word line is driven in the program operation.

5. The program method according to claim 1, when the first setup voltage corresponding to a program-verification setup voltage and the second word line is driven in the program-verification operation.

6. The program method according to claim 1, wherein the first and the second memory sectors correspond to adjacent physical addresses.

7. The program method according to claim 1, further comprising:
   having the second word line biased with a second setup voltage and having the first word line driven in the other one of the program operation and the program-verification operation.

8. The program method according to claim 7, further comprising:
   determining a first operation phase and a second operation phase.

9. The program method according to claim 8, wherein the step of having the second word line biased with the second setup voltage and having the first word line driven in the other one of the program operation and the program-verification operation is executed in the second operation phase.

10. The program method according to claim 8, wherein the step of having the first word line biased with the first setup voltage and having the second word line driven in one of the program operation and the program-verification operation is executed in the first operation phase.

11. A flash memory, comprising:
    a memory array and a memory accessing circuit; and
    a control circuit, connected to the memory accessing circuit and the memory array, for selecting a first memory sector and a second memory sector, which are respectively correspond to a first word line and a second word line, in the memory array, wherein,
    the control circuit has the first word line biased with a first setup voltage, wherein the first setup voltage corresponding to a program setup voltage or a program-verification setup voltage, and has the second word line driven in one of a program operation and a program-verification operation, via the memory accessing circuit.

12. The flash memory according to claim 11, when the first setup voltage corresponding to a program setup voltage and the second word line is driven in the program-verification operation.

13. The flash memory according to claim 11, when the first setup voltage corresponding to a program setup voltage and the second word line is driven in the program operation.

14. The flash memory according to claim 11, when the first setup voltage corresponding to a program-verification setup voltage and the second word line is driven in the program operation.

15. The flash memory according to claim 11, when the first setup voltage corresponding to a program-verification setup voltage and the second word line is driven in the program-verification operation.

16. The flash memory according to claim 11, wherein the first and the second memory sectors correspond to adjacent physical addresses.

17. The flash memory according to claim 11, wherein the control circuit further has the second word line biased with a second setup voltage and has the first word line driven in the other one of the program operation and the program-verification operation, via the memory accessing circuit in the second operation phase.

18. The flash memory according to claim 17, wherein the control circuit further determines a first operation phase and a second operation phase.

19. The flash memory according to claim 18, wherein the control circuit has the first word line biased with the first setup voltage and has the second word line driven in one of the program operation and the program-verification operation, via the memory accessing circuit in the first operation phase.

20. The flash memory according to claim 18, wherein the control circuit further has the second word line biased with the second setup voltage and has the first word line driven in the other one of the program operation and the program-verification operation, via the memory accessing circuit in the second operation phase.

* * * * *